United States Patent [19]

Lee et al.

[11] Patent Number: 5,241,502

[45] Date of Patent: Aug. 31, 1993

[54] DATA OUTPUT BUFFER CIRCUIT WITH PRECHARGED BOOTSTRAP CIRCUIT

[75] Inventors: Jang-kyu Lee; Seong-wook Jeong, both of Seoul, Rep. of Korea

[73] Assignee: Samsung Electronics Co., Ltd., Kyunggi, Rep. of Korea

[21] Appl. No.: 643,285

[22] Filed: Jan. 22, 1991

[30] Foreign Application Priority Data

Aug. 9, 1990 [KR] Rep. of Korea ............... 90-12227

[51] Int. Cl.⁵ .................... G11C 11/40; G11C 7/00
[52] U.S. Cl. ............................ 365/203; 365/189.05
[58] Field of Search ............ 365/203, 189.05, 189.09

[56] References Cited

U.S. PATENT DOCUMENTS

| | | | |
|---|---|---|---|
| 3,959,781 | 5/1976 | Mehta et al. | 365/210 |
| 4,707,625 | 11/1987 | Yanagisawa | 365/203 |
| 4,751,679 | 6/1988 | Dehganpour | 365/230.01 |
| 4,807,190 | 2/1989 | Ishii et al. | 365/189.09 |
| 4,894,559 | 1/1990 | Kaneko | 365/203 |
| 4,912,679 | 3/1990 | Shinoda et al. | 365/230.01 |
| 4,941,128 | 7/1990 | Wada et al. | 365/203 |
| 4,943,952 | 7/1990 | Terayama | 365/203 |
| 4,996,671 | 2/1991 | Suzuki et al. | 365/203 |
| 5,058,066 | 10/1991 | Yu | 365/203 |
| 5,103,113 | 4/1992 | Inui et al. | 365/203 |
| 5,121,356 | 6/1992 | Park et al. | 365/203 |

*Primary Examiner*—Eugene R. LaRoche
*Assistant Examiner*—Michael C. Kessell

*Attorney, Agent, or Firm*—Cushman, Darby & Cushman

[57] ABSTRACT

A data output buffer circuit includes a pair of data lines respectively applied with a noninverted data signal and an inverted data signal and an output gate circuit for gating the noninverted and inverted data signals in response to an output enable signal. A pull-up/pull-down NMOS transistor pair is connected in series between a first supply voltage and a ground voltage. A supply voltage converter circuit generates a constant second supply voltage so long as said first supply voltage is above a predetermined minimum level. A bootstrap circuit is precharged by the second supply voltage for driving the pull-up NMOS transistor with a boosted voltage level when the non-inverted data signal is a logic "HIGH" state. The bootstrap circuit includes a first NMOS transistor, a main capacitor, a secondary capacitor, second and third NMOS transistors to precharge the secondary capacitor, an overcurrent limit circuit for limiting overcurrent into the secondary capacitor, a first CMOS inverter for transferring the boosted voltage from the main capacitor to a gate electrode of the pull-up transistor during the logic "HIGH" state, and for transferring the ground voltage during a logic "LOW" state, and a second CMOS inverter for transferring the second supply voltage to a second terminal of the main capacitor during the logic "HIGH" state, and for transferring the ground voltage thereto during the logic "LOW" state.

5 Claims, 7 Drawing Sheets

DATA OUTPUT BUFFER CIRCUIT WITH PRECHARGED BOOTSTRAP CIRCUIT

FIELD OF THE INVENTION

The present invention relates to a data output buffer circuit, and more particularly to a data output buffer circuit of a high-density semiconductor memory device.

BACKGROUND OF THE INVENTION

Recently, according to tendency of the high-density of semiconductor memory devices into more than 16 Mbit, the size of a basic device, such as MOS transistor has been decreased to units of submicron.

Therefore, active and intensive research has been ongoing to improve the operating speed and the reliability of semiconductor memory devices according to reduced size of basic elements.

These high-density semiconductor memory devices comprise CMOS and NMOS circuits. Generally, semiconductor memory devices, for instance, DRAM devices include a data output buffer which has large current driving capability to increase fan-out of data output terminal connected thereto.

The data output buffer includes pull-up devices and pull-down devices connected in series between a supply voltage line and a ground line. The data output buffer applies supply voltage Vcc to a data output terminal connected to the node of the data output buffer through the pull-up device for outputting a high level of data output. And the data output buffer couples ground potential GND to a data output terminal connected to the node of the data output buffer through a pull-down device for outputting a low level of data output is outputted. However, in the case that the pull-up and pull-down devices constituting the data output buffer consist of NMOS transistors, a decreased voltage, which is decreased by threshold voltage VTN of NMOS transistor from the supply voltage Vcc when the data of "HIGH" is outputted, is applied to a data output terminal with the result that operation margin of a high level of data is reduced and the operating speed becomes slow.

Also in the case that the pull-up and pull-down devices constituting the data output buffer consist of CMOS transistors, the high level of data of vcc and improved operating speed can be obtained. However, it still has disadvantages of latch-up which peculiarly results from the CMOS circuit.

To obviate the above disadvantages, a bootstrap circuit is incorporated into a data output buffer made of NMOS transistors, in which a pull-up device is driven by a boosted voltage, so that a high level of data is outputted as a supply voltage level. Although the data output buffer comprising the bootstrap circuit can achieve the improved operation margin and the operating speed in a low level of supply voltage, it has the following disadvantage in the state transition of data in a high level of supply voltage.

That is, undesirable ringing occurs due to greater overdrive, which gives rise to secondary overshoot exceeding the maximum low level output voltage VOL max.

Such secondary overshoot causes reduction of a low level noise margin NML and simultaneously delays an arrival time of the stable low level output, with the result that the access time is lengthened. At this time, low level noise margin NML is determined by the difference between the maximum low level input voltage VIL max of the device to be driven and the maximum low level output voltage of the driving device VOL max.

Figure 1:
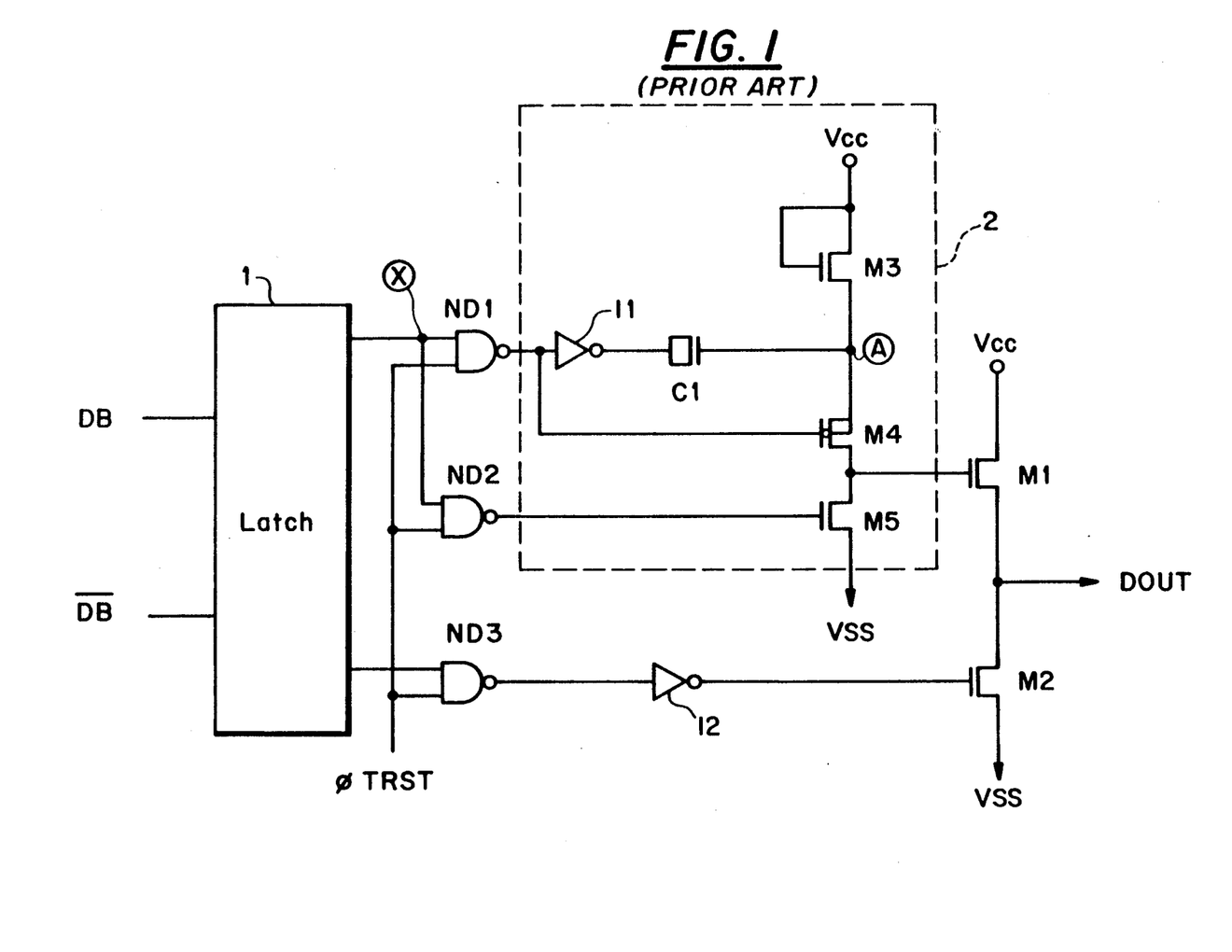
FIG. 1 is a circuit diagram of a conventional data output buffer.

In the circuit of FIG. 1 which is also illustrated in Korean Patent Application No. 89-11995 filed by the same applicant, a voltage of a node A is pumping at Vcc-VTN during the first read-cycle in an enable-state of a semiconductor memory chip. Therefore, an access time of a high logic data becomes long because the pumping level is low.

To raise the pumping level, if the size of a pumping capacitor $C_1$ is made to increase, the reduction of the operating speed can be prevented at Vcc of the low level but noises of a supply voltage and ground line occur at the supply voltage Vcc of the high level. Also, in case of a high level Vcc in the small size of a pumping capacitor $C_1$, since an invalid "HIGH" level of voltage is high level, the noise of the ground line occurs by the undershoot during the valid falling transition.

Figure 2:
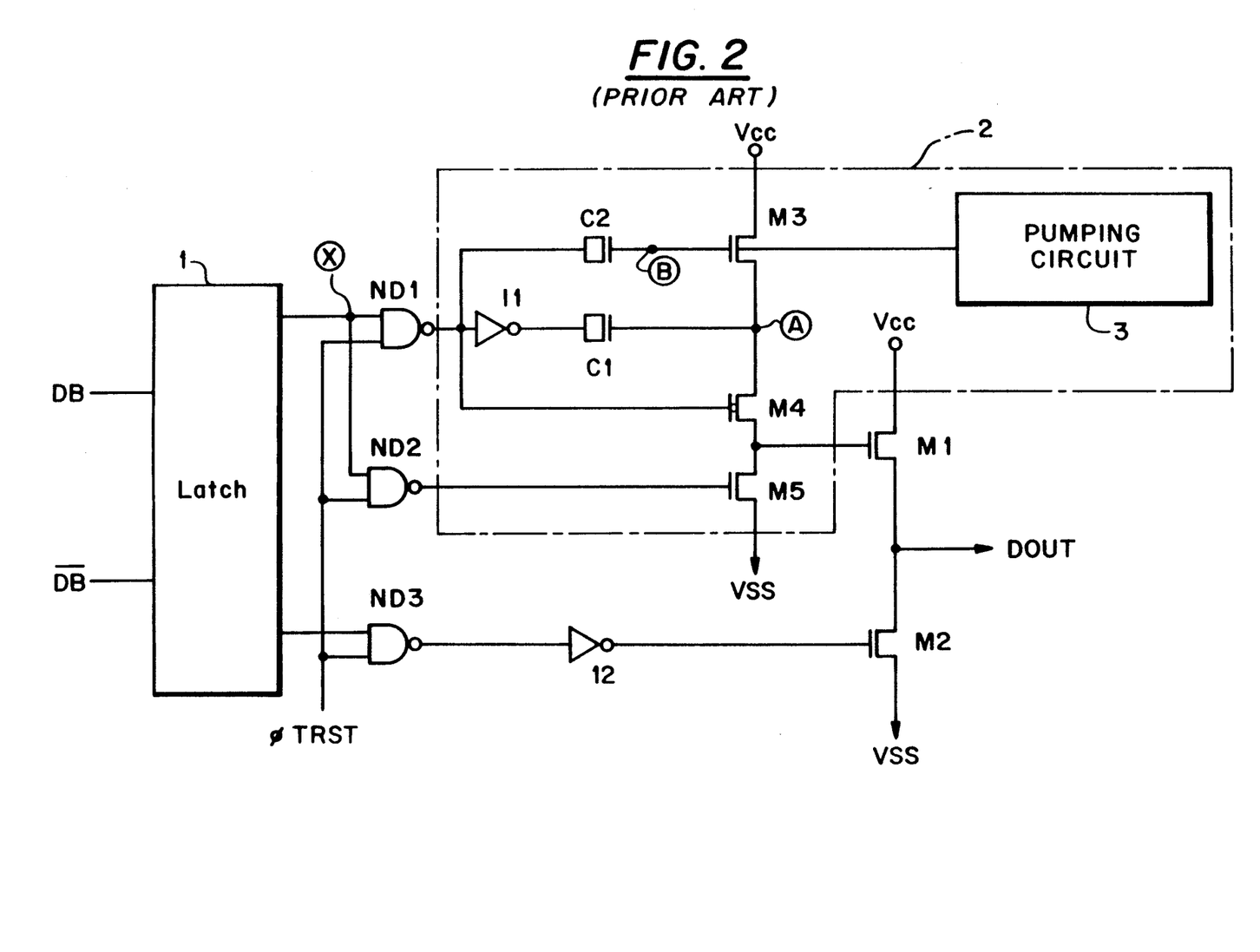
FIG. 2 is a circuit diagram of another conventional data output buffer.

Referring to the circuit of FIG. 2, by making the voltage of node A full Vcc through the initial pumping circuit 3, the boosting voltage level during the first read cycle is high although the same pumping capacitor is of the same size as that of FIG. 1. However, the noise of supply voltage line due to an invalid "High" at a high level Vcc is also large.

To reduce this noise, it is required that the size of pull-down transistor be reduced or the rising transition of the gating signal smooth, which inevitably leads to a slow operating speed.

Figure 3A:
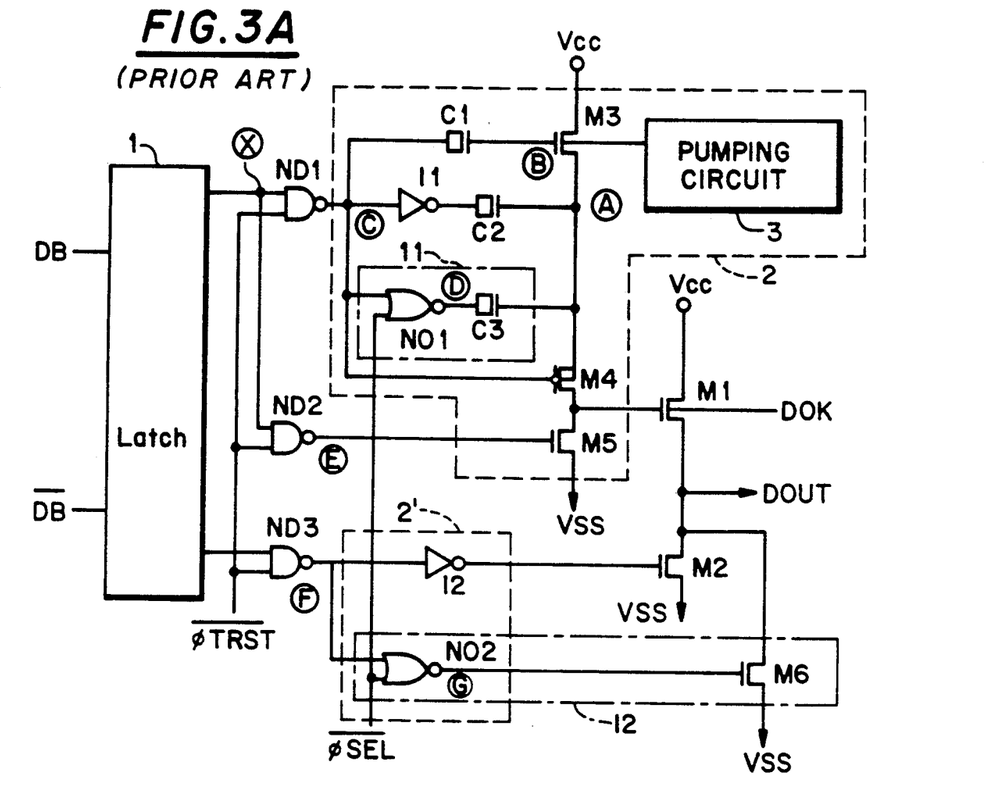
FIGS. 3A and 3B are circuit diagrams of still another conventional data output buffer.
Figure 3B:
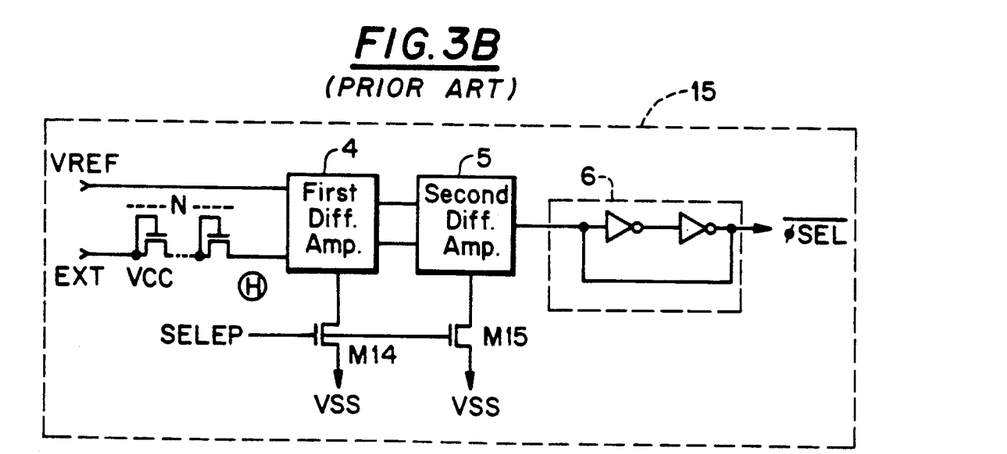

To eliminate above disadvantages, Korean Patent Application No. 89-11995 disclosed a circuit as shown in FIG. 3, which circuit further comprises as auxiliary means, a pumping capacitor $C_3$ and a pull-down transistor M6. Below a predetermined supply voltage level, the operating speed is improved by operating the auxiliary means, also above the predetermined supply voltage level having the problem of the noises of supply line and ground line, the line noise is greatly reduced by not operating the auxiliary means.

However, since the circuit of FIG. 3 should include extra pumping capacitor $C_3$, pull-down transistor M6 and control the means NO1, NO2 to control above devices, a circuit configuration is complicated and more chip area is occupied, thereby preventing high-density integration.

SUMMARY OF THE INVENTION

Accordingly, it is an object of the present invention to provide a data output buffer circuit which can improve a low noise margin during a low-going transition of the data.

It is another object of the present invention to provide a data output buffer circuit suitable for a high-density semiconductor memory device.

It is still another object of the present invention to provide a data output buffer circuit which has a constant bootstrapping voltage regardless of the fluctuation of an external supply voltage.

In achieving the above objects, a data output buffer of the present invention comprises a pair of data lines respectively applied with a noninverted data signal and an inverted data signal;

an output gate means for gating said noninverted and inverted data signals in response to the output enable signal;

a pair of pull-up and pull-down NMOS transistors connected in series between a first supply voltage line and a ground line;

a supply voltage converter circuit for generating a second supply voltage of a constant level above a predetermined level regardless of the first supply voltage by inputting the first supply voltage supplied to said first supply voltage line; and a bootstrap circuit precharged by receiving said second supply voltage, and for driving said pull-up NMOS transistor with a boosted voltage level through said output gate means when a data "HIGH" is driven.

The data output buffer circuit of the present invention as described above can improve the operating speed and reduce the noise generated by the ringing generated during the transition state of data by providing constant boosting voltage regardless of supply voltage of high level.

DESCRIPTION OF THE PREFERRED EMBODIMENT

Figure 4:
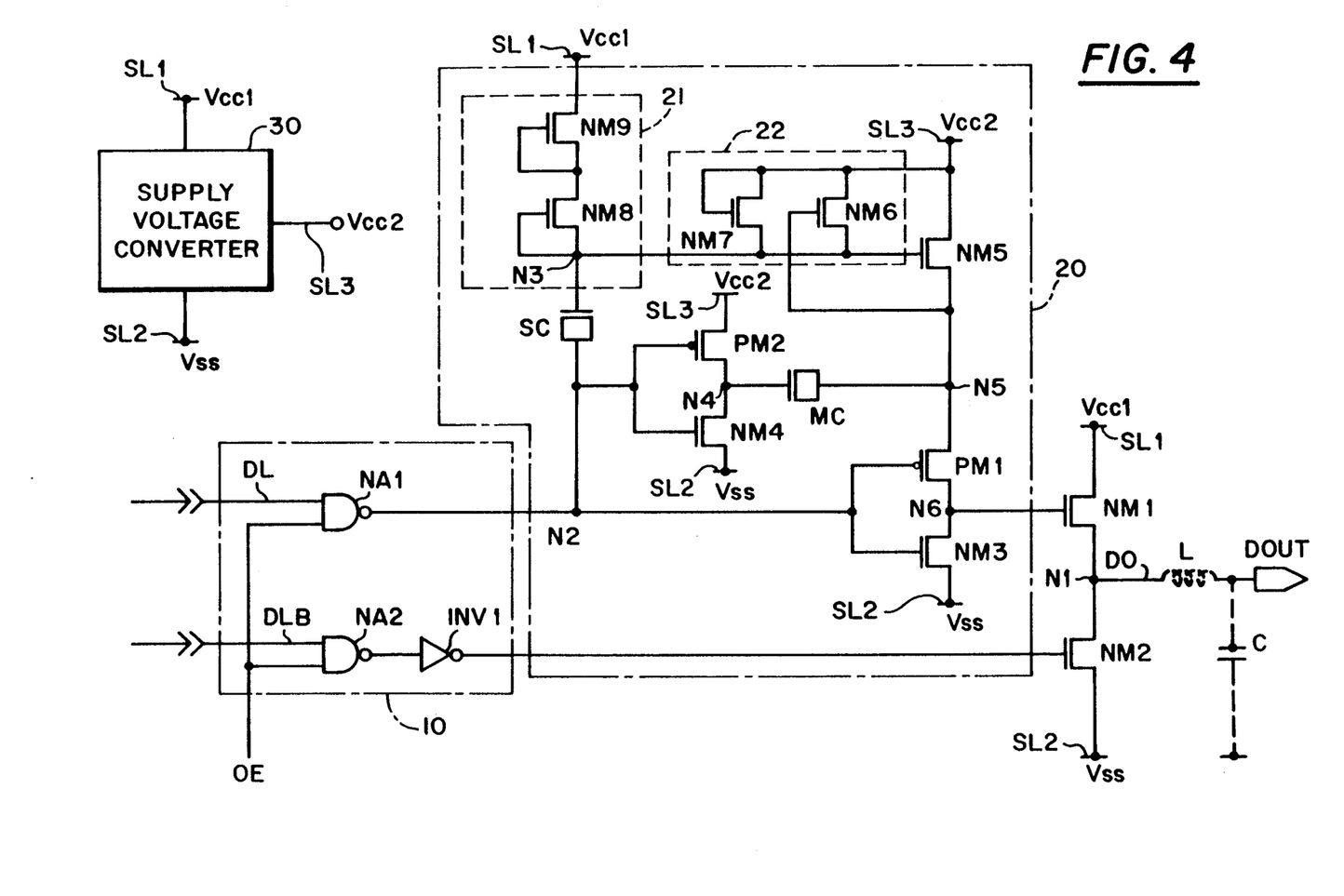
FIG. 4 is a circuit diagram of one embodiment of the data output buffer according to the present invention.

Referring to FIG. 4, the data output buffer comprises a pair of data line DL and DLB, an output gate means 10, a pair of pull-up and pull-down NMOS transistors NM1 and NM2, a bootstrap circuit 20 and a supply voltage converter circuit 30.

To the pairs of data lines DL and DLB, a noninverted and an inverted data signal are applied, respectively, from a sense amplifier which senses and amplifies a read-out data from the memory cell during the data read.

The output gate means 10 comprises NAND gates NA1 and NA2 and inverter INV1 for gating the noninverted and inverted data signals respectively loaded on a pair of data lines DL and DLB in response to an output enable signal OE.

The inverted data signal which inverted at said inverter INV1 through the NAND gate NA2 is applied to a gate of said pull-down transistor NM2. The noninverted data signal which passed through said NAND gate NA1 is applied to a gate of said pull-up transistor NM1 through a bootstrap circuit 20. The pull-up and pull-down NMOS transistors NM1 and NM2 are connected in series with each other between a first supply voltage line SL1(Vcc1 voltage level) and a ground line SL2 (Vss voltage or zero voltage level). The pull-up NMOS transistor NM1 is to output the Vcc1 to the node N1 fully turned on if the boosted voltage is applied to a gate electrode when data "HIGH" is driven. The pull-down NMOS transistor NM2 is fully turned on to output the ground potential to the node N1 if the inverted data "HIGH" is applied to the gate electrode when data "LOW" is driven.

The node N1 is connected to a data output terminal DOUT through an output line DO. The output line DO has an inductance component L which is coupled in series between the node N1 and a data output terminal DOUT as well as a conductance component C which exists between the data output terminal DOUT and the ground line SL2.

The inductance component L and conductance component C generate noise, by ringing during a state transition of data output, and decrease the operating speed.

The bootstrap circuit 20 comprises main capacitor MC, subcapacitor SC, NMOS transistors NM3 through NM9 and PMOS transistors PM1 and PM2. The NMOS transistor NM3 and PMOS transistor PM1 constitute a CMOS inverter connected between the node N5 and the ground line SL2. The output terminal of NAND gate NA1 of said output gate means 10 is connected to a node N2 connected with the gates of NMOS transistor NM3 and PMOS transistor NM3 and PM1. The gate of pull-up NMOS transistor NM1 is connected to a node. N6 connected with the drain of said NMOS transistor and a PMOS transistor NM3 and PM1. CMOS inverter consisting of a NMOS transistor NM4 and a PMOS transistor NM4 and PM2 is connected between second supply power line SL3 and ground line SL2.

The gate electrodes of the PMOS transistor PM2 and the NMOS transistor NM4 are connected to the node N2 and the drains of the PMOS transistor PM2 and the NMOS transistor NM4 are commonly connected to a node N4. Main capacitor MC is connected between the node N4 and the node N5. Second supply voltage line SL3 and node N5 are respectively connected to the drain and the source of NMOS transistor NM5. A secondary capacitor SC is connected between the node N2 and an node N3 to which the gate of a NMOS transistor NM5 is connected. The drains and sources of NMOS transistors NM6 and NM7 are respectively connected to second supply voltage line SL3 and a node N3. The gate of the NMOS transistor NM6 is connected to the node N5 and the gate of NMOS transistor NM7 is connected to the drain of NMOS transistor NM6. An overcurrent limit means 21 composed of diode type NMOS transistors NM8 and NM9 is connected between the first supply voltage line SL1 and the node N3. The drain and gate of each NMOS transistor NM8 and NM9 are connected to each other. The overcurrent limit means 21 is turned on when voltage level of the node N3 goes above $Vcc_1 + 2VTN$ and then prevents the voltage level of the node N3 from rising more than necessary by passing the overcurrent to the first supply voltage line SL1.

Here, the overcurrent limit means 21 may consist of unidirectional current conductive devices, e.g., diode or zenor diode having a constant threshold voltage.

The capacitors SC and MC utilize the capacitance between a gate and a channel region of an NMOS transistor.

The supply voltage converter circuit 30 is connected between a first supply voltage line SL1 and a ground line SL2 and then supplies a second supply voltage $Vcc_2$ to a second supply voltage line SL3. When the first supply voltage $Vcc_1$ level is less than a predetermined level, the first supply voltage $Vcc_1$ is generated and supplied to the second supply voltage line SL3 as the second supply voltage $Vcc_2$. When the first supply voltage $Vcc_1$ level is more than predetermined level, the second supply voltage $Vcc_2$ having a predetermined level is generated.

Figure 5:
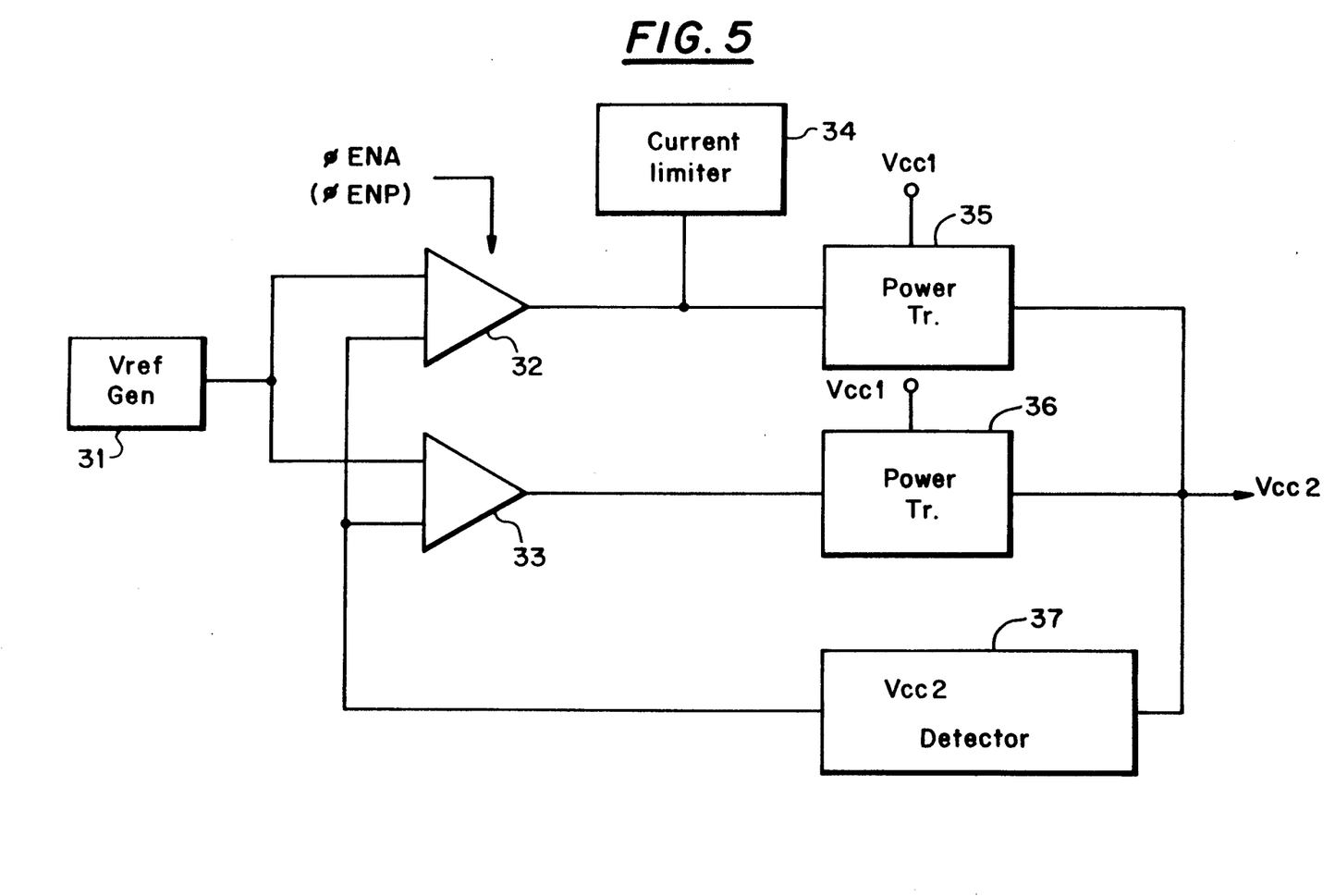
FIG. 5 is a block diagram for a supply voltage converter means of the data output buffer of FIG. 4.

An embodiment of a supply voltage converter circuit 30, as shown in FIG. 5, comprises a reference voltage generator 31, first and second differential amplifiers 32 and 33, current limiter 34, first and second power transistors 35 and 36 and an output voltage detector 37.

An output voltage $Vcc_2$ of said supply voltage converter circuit 30 is determined by the following equation:

$$Vcc_2 = VREF \times \left(1 + \frac{R1}{R2}\right)(V)$$

The supply voltage converter circuit 30, which was disclosed in Korean Patent Application No. 89-5792 filed by the same applicant was open to public through Semiconductor Technical Journal Vol. 4, No. 1 June, 1989, page 1 to 6, especially in FIG. 3 of page 3. Here, it should be understood that the present invention of the supply voltage converter circuit is not limited to the specific embodiments described in this specification and may be changed or modified without departing from the scope of technology.

The operation of the present invention will be described below.

In an embodiment of the present invention, a first supply voltage $Vcc_1$ has a reference level of 5V, a low level of less than 4V and a high level of above 6V. The second supply voltage $Vcc_2$ of the supply voltage converter means 30 remains at 4V when the first supply voltage Vcc is above 4V.

In FIG. 4, at a state of output disable, since a potential at node N2 is at a high level, node N3 is boosted to a voltage of $Vcc_2+2VTN$ by pumping of precharged capacitor SC through the NMOS transistor NM3. Here, VTN is threshold voltage of a MOS transistor. Also, the NMOS transistor NM4 turns on, so that node N4 reaches a low level. The NMOS transistor NM5 fully turns on by a boosted voltage of $Vcc_2+VTN$ to supply sufficient current to main capacitor MC, so that node N5 is charged to a second supply voltage $Vcc_2$. Here, a PMOS transistor PM1 remains turned off. Accordingly, the pull-up and pull-down NMOS transistors NM1 and NM2 remain turned off, so that the output node N1 remains at a high impedance level.

At a state of output enable, when data "HIGH" is driven, the potential at a node N2 decrease to a low level from a high level. According to this state transition, a voltage at node N3 decrease approximately to $Vcc_2-2VTN$ from $Vcc_2+2VTN$. Simultaneously, since PMOS transistor PM1 is turned on, node N6 is supplied with the voltage of $Vcc_2$ which is precharged to the main capacitor MC, and then the pull-up transistor NM1 is turned on. Also, since the voltage of $Vcc_2$ is applied to the node N4 through the PMOS transistor PM2, the potential of the node N5 is risen to $Vcc_2+2VTN$. Therefore, the pull-up transistor NM1 is fully turned on by the voltage of $Vcc_2+2VTN$, and then the potential of the node N1 is risen to the level of the first supply voltage of $Vcc_1$. At this point, in a waveform of the output terminal DOUT, an overshoot is generated due to a ringing by an inductance component L and a capacitance component C. Also, when the potential of the node N5 is raised to $Vcc_2+2VTN$, the NMOS transistor NM6 is also fully turned on, and then charged current is supplied to the secondary capacitor SC. Accordingly, the potential of the node N3 becomes $Vcc_2-VTN$ from $Vcc_2-2VTN$, and then remains at the $Vcc_2$ level.

When the data changes from "HIGH" level to "LOW" level, the potential of the node N2 becomes a high level and the potential of the node N6 becomes a ground potential, the pull-up transistor NM1 is turned off, the pull-down transistor NM2 is turned on and then the potential of the node N1 falls down to ground level from $Vcc_1$ level.

Also, when the potential of the node N2 rises to "HIGH" level, since the potential of the node N4 falls to "LOW" level, the potential of the node N5 falls to $Vcc_2-2VTN$. The potential of the node N3 rises to $Vcc_2+2VTN$. Therefore, since the NMOS transistor NM5 is fully turned on, the potential of the node N5 keeps the level of $Vcc_2$.

When the potential of node N3 rises to above $Vcc_2+2VTN$ due to the inflow of the overcurrent by the momentary overloading, the NMOS transistors NM8 and NM9 of the overcurrent limit means are turned on to bypass the overcurrent to the first supply voltage line, thereby protecting from overcurrent.

Figure 6:
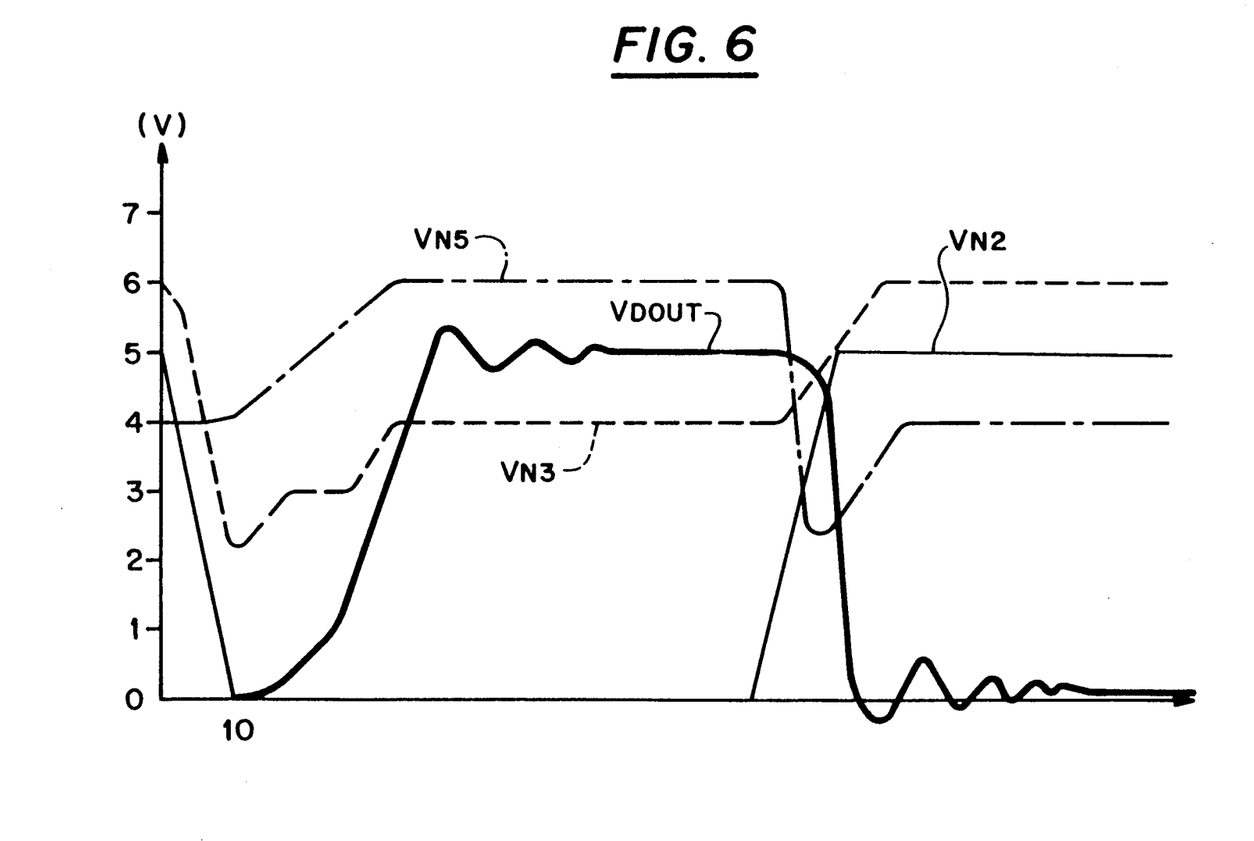
FIG. 6 is a wave form chart showing the relation between the respective node voltages and data output voltage when high level supply voltage Vcc1 is applied to the data output buffer of FIG. 4.

FIG. 6 is a wave form chart showing the relation of respective node voltages and the data output voltage in case that a supply voltage of high level, e.g., 6V is applied to the circuit of FIG. 4 according to the present invention.

Here, a voltage wave form chart VN5 of a node N5 coupled with a gate electrode of the pull-up transistor NM1 is fixed at a constant value, e.g., $Vcc_2+2VTN$, regardless of the supply voltage. If the value for $Vcc_2$ is 4V and the value for VTN is approximately 1V, the value for $Vcc_2+2VTN$ will be 6V. Since the first supply voltage $Vcc_1$ supplied to the drain of the pull-up transistor NM1 is 6V, and a boosted voltage VN5 applied to the gate is 6V, the pull-up transistor NM1 is not fully turned on. Therefore, the high level of data output rises up to 5V which is equal to $Vcc_1-VTN$.

Figure 7:
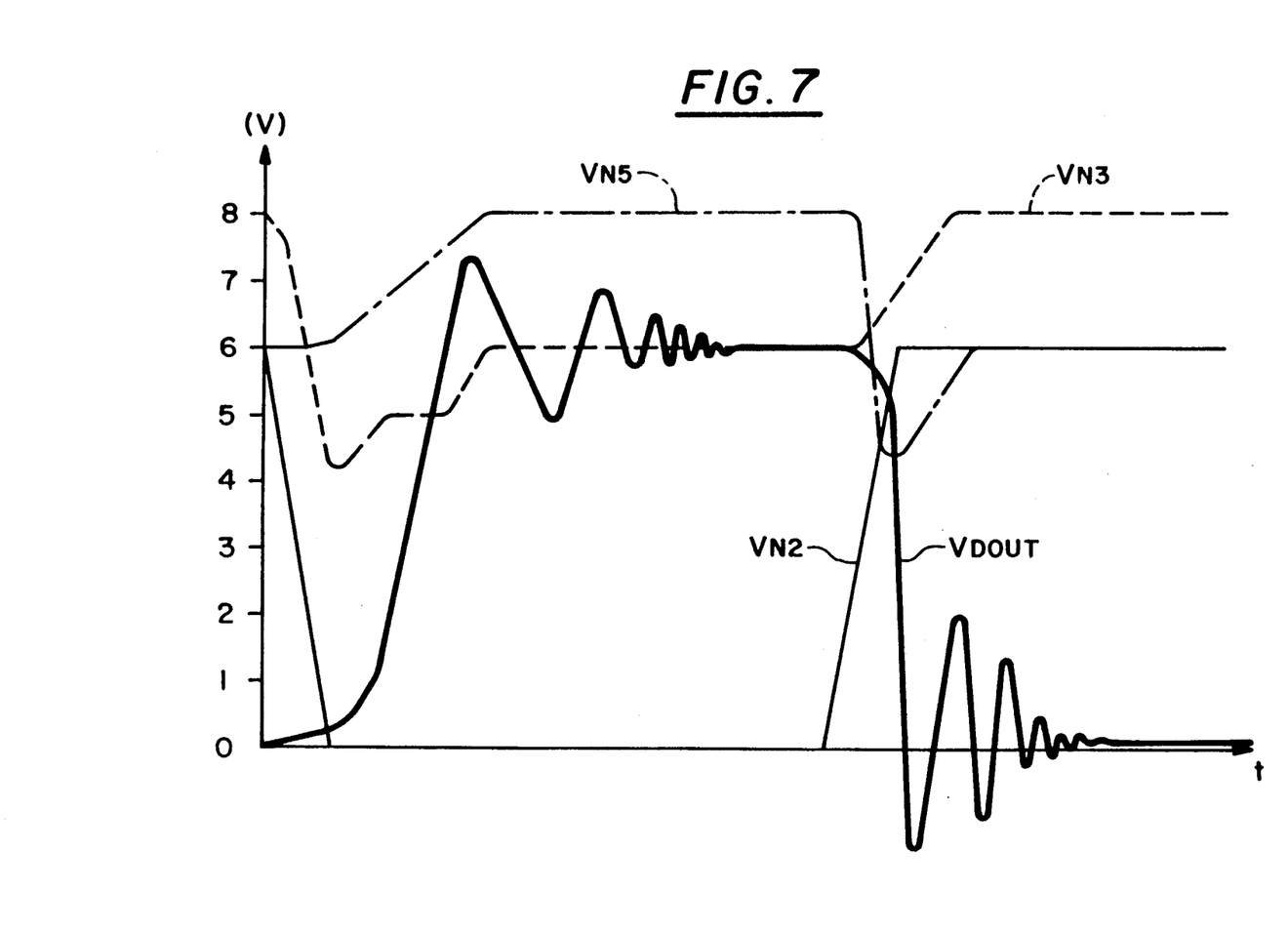
FIG. 7 is a wave form chart showing the relation between the respective node voltages and data output voltage when the first power source voltage Vcc1 of high level, not the second power source voltage Vcc2, is applied to the bootstrap circuit of FIG. 4.

FIG. 7 is a wave form chart showing the relation of respective node voltages and data output voltage in case where a first supply voltage of 6V is applied to bootstrap circuit 20 in FIG. 4 and not the second supply voltage Vcc2. Since the voltage VN5 of a node N5 supplied to the gate of the pull-up transistor NM1 fluctuates according to the supply voltage level, the voltage VN5 of a node N5 rises up to about 8V. Since the pull-up transistor NM1 is fully turned on, the data output signal has the first supply voltage, that is, the swing width of 6V. Therefore, the overshoot is large due to the ringing generated during the state transition. This gives rise to noise of the driven device and makes the operating speed slow because it takes a long time to recover stable state.

As described above, according to the present invention since the swing width of the data output signal remains constant above a specific level regardless of level fluctuation of the first supply voltage, the noise of the Vcc and ground line is decreased and the secondary overshoot occurring due to the ringing during the state transition is decreased, so that rise time or fall time becomes shortened because the recovery time to the stable state is short. This contributes to an improvement of operating speed.

The present invention has been described by way of the preferred embodiment. However, many widely different embodiments may be provided without departing from the spirit and scope of the present invention as defined in the appended claims.

What is claimed is:

1. A data output buffer circuit comprising:
   a pair of data lines respectively applied with a noninverted data signal and an inverted data signal;
   output gate means for gating said noninverted and inverted data signals in response to an output enable signal;
   a transistor pair comprising a pull-up and a pull-down NMOS transistor connected in series between a first supply voltage and a ground voltage;
   a supply voltage converter circuit, responsive to said first supply voltage, for generating a constant second supply voltage so long as said first supply voltage is above a predetermined minimum level; and
   a bootstrap circuit, precharged by receiving said second supply voltage, for driving said pull-up NMOS transistor with a boosted voltage level when said non-inverted data signal is a logic "HIGH" state, said bootstrap circuit comprising:
   a first NMOS transistor for coupling the second supply voltage from said supply voltage converter circuit to a first terminal of a main capacitor;
   a secondary capacitor for fully turning on said first NMOS transistor during said logic "HIGH" state;
   a second NMOS transistor and a third NMOS transistor for coupling the second supply voltage to a first terminal of said secondary capacitor to precharge said secondary capacitor;
   overcurrent limit means for limiting overcurrent into said secondary capacitor;
   a first CMOS inverter, connected between the first terminal of said main capacitor and the ground voltage, for transferring the boosted voltage from the main capacitor to a gate electrode of said pull-up transistor during said logic "HIGH" state, and for transferring the ground voltage during a logic "LOW" state; and
   a second CMOS inverter, connected across said second supply voltage and the ground voltage, for transferring the second supply voltage to a second terminal of the main capacitor during said logic "HIGH" state, and for transferring the ground voltage thereto during said logic "LOW" state.

2. The data output buffer circuit as claimed in claim 1, wherein said predetermined minimum level is 4V.

3. The data output buffer circuit as claimed in claim 1, wherein said second NMOS transistor includes a drain connected to said second supply voltage, a gate connected to the first terminal of said main capacitor and a source connected to the first terminal of said secondary capacitor, and said third NMOS transistor includes a drain connected to the second supply voltage, a gate connected to said drain, and a source connected to the first terminal of said secondary capacitor.

4. The data output buffer circuit as claimed in claim 2, wherein said overcurrent limit means comprises two transistors connected in series between the first terminal of said secondary capacitor and the first supply voltage, each of said transistors having their respective drain and gate commonly connected.

5. The data output buffer circuit as claimed in claim 1, wherein said output gate means comprises:
   a first NAND gate for coupling said noninverted data signal to said bootstrap circuit in response to said output enable signal; and
   a second NAND gate for coupling said inverted data signal to a gate of said pull-down NMOS transistor through an inverter in response to said output enable signal.

* * * * *